(12) United States Patent
Mallory et al.

(10) Patent No.: US 7,629,798 B2
(45) Date of Patent: Dec. 8, 2009

(54) WAFER EDGE-DEFECT DETECTION AND CAPACITIVE PROBE THEREFOR

(75) Inventors: Roy Mallory, Bedford, MA (US); Jaydeep Kumar Sinha, Mansfield, MA (US); Stephen MacLeod, Mansfield, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 293 days.

(21) Appl. No.: 11/807,235

(22) Filed: May 25, 2007

(65) Prior Publication Data

US 2008/0290881 A1    Nov. 27, 2008

(51) Int. Cl.
*G01R 27/26*    (2006.01)
*G01R 31/02*    (2006.01)

(52) U.S. Cl. ........................ 324/690; 324/686; 324/754

(58) Field of Classification Search ................. 324/690, 324/686, 658, 649, 600, 754, 757, 758, 715, 324/724, 437, 446, 696, 661
See application file for complete search history.

(56) References Cited

U.S. PATENT DOCUMENTS

| | | | | |
|---|---|---|---|---|
| 4,158,171 | A * | 6/1979 | Abbe et al. | 324/754 |
| 4,849,916 | A * | 7/1989 | Abbe et al. | 702/170 |
| 4,958,129 | A * | 9/1990 | Poduje et al. | 324/661 |
| 6,867,855 | B2 * | 3/2005 | Go et al. | 356/237.1 |
| 7,280,200 | B2 * | 10/2007 | Plemmons et al. | 356/237.3 |
| 7,366,344 | B2 * | 4/2008 | Sim | 382/149 |

* cited by examiner

*Primary Examiner*—Hoai-An D Nguyen
(74) *Attorney, Agent, or Firm*—Luedeka, Neely & Graham, P.C.

(57) ABSTRACT

A wafer edge-defect detection system with a probe assembly having one or more capacitive plates conforming in edge shape to an edge shape of a wafer; and processing electronics for electronically driving the one or more capacitive plates and for sensing an electrical signal representing capacitance between each one or more plates and the wafer. Filtering and demodulation techniques enhance the signal to noise ratio.

14 Claims, 6 Drawing Sheets

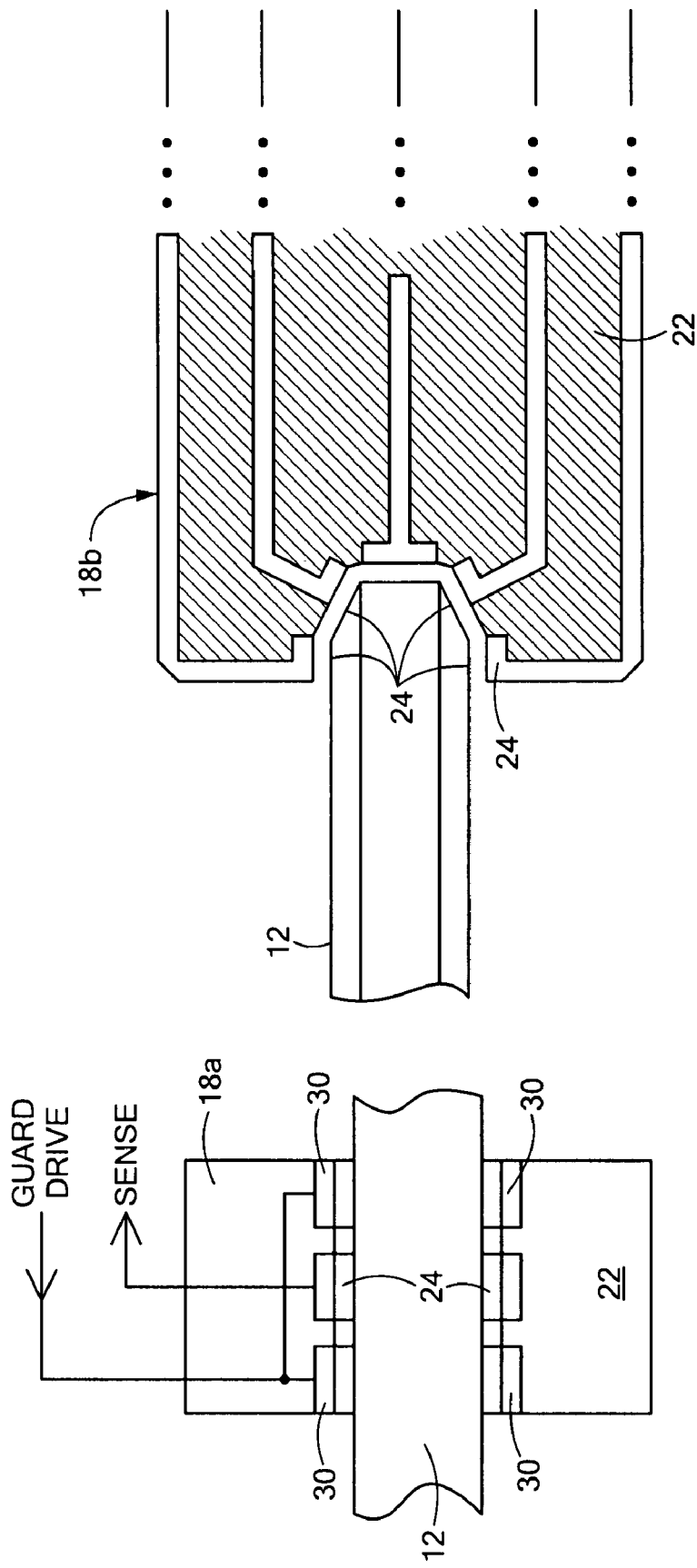

WAFER EDGE-DEFECT DETECTION AND CAPACITIVE PROBE THEREFOR

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention related to testing of wafers such as semiconductor wafers for defects and their characterization.

In the production of MEMS, NEMS, or standard semiconductor devices a starting point is a wafer to be processed. The minute constructions produced in such wafers during processing requires that no significant defects exist in the region being processed. The edges of wafers, the region of one to three or five mm from the absolute edge, is prone to defects and is wafer real estate that can nevertheless be used for processing in the absence of defects.

Present day test equipment is not up to the task of providing the needed level of accuracy in testing near their edges. At the edge many of the error sources are also at their worst. Furthermore dimensional variations are significant problems limiting the closeness that a probe can be placed to the wafer under measurement. On the other hand, the narrower the capacitive gap the higher the sensitivity and resolution. Because the edge has a two dimensional variation in shape. The placement of large-area probes that could be used of the surface of the wafer is not practical. The error component of probe signal as the edge also is much higher in level than the signal being sought.

BRIEF SUMMARY OF THE INVENTION

According to the present invention a wafer edge detection system has a probe assembly with one or more capacitive plates whose shape may conform to an edge shape of a wafer. Processing electronics drives the one or more capacitive plates and has means for sensing an electrical signal representing capacitance between each one or more plates and the wafer.

The signal is processed to eliminate noise and in the case of two or more probe elements sum and difference and other processing may be used to eliminate common mode and run-out errors among other. The final signal has a usable signal to noise ratio.

BRIEF DESCRIPTION OF THE SEVERAL VIEWS OF THE DRAWINGS

These and other features of the invention are described below in conjunction with the Drawing of which:

FIG. 2B illustrates the addition of guard electrodes to the invention;

FIG. 2C illustrates a multi probe embodiment f the invention;

DETAILED DESCRIPTION OF THE INVENTION

Figure 1:
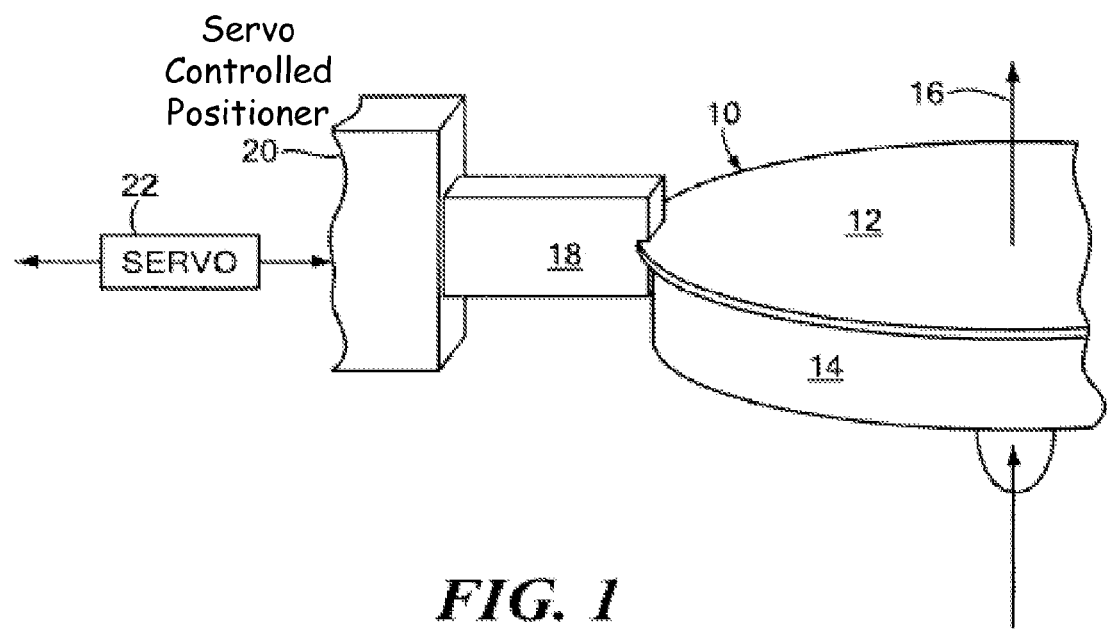
FIG. 1 schematically shows a wafer edge detection station.

FIG. 1 shows a test station according to the invention for electronically evaluating the edge 10 of a wafer 12, typically a semiconductor wafer. The wafer 12 is supported on a turntable 14 for rotation about an axis 16 in the center of the wafer. It is preferable that the turntable be of high precision so that the edge 10 rotates with minimal run-out error due to eccentricity in its spin allowing the measuring probe assembly 18 to be placed within a few (50-100) microns of the edge without fear of it being hit and thus allowing high sensitivity in the measurement.

To that end, the probe assembly is optionally mounted on a servo controlled positioner 20 driven under servo control from processing electronics, described below. This electronics is responsive to the signals from edge sensing probe assembly 18 to maintain a desired distance between probe capacitance plates in the probe assembly 18 and the edge of the wafer.

Figure 2A:
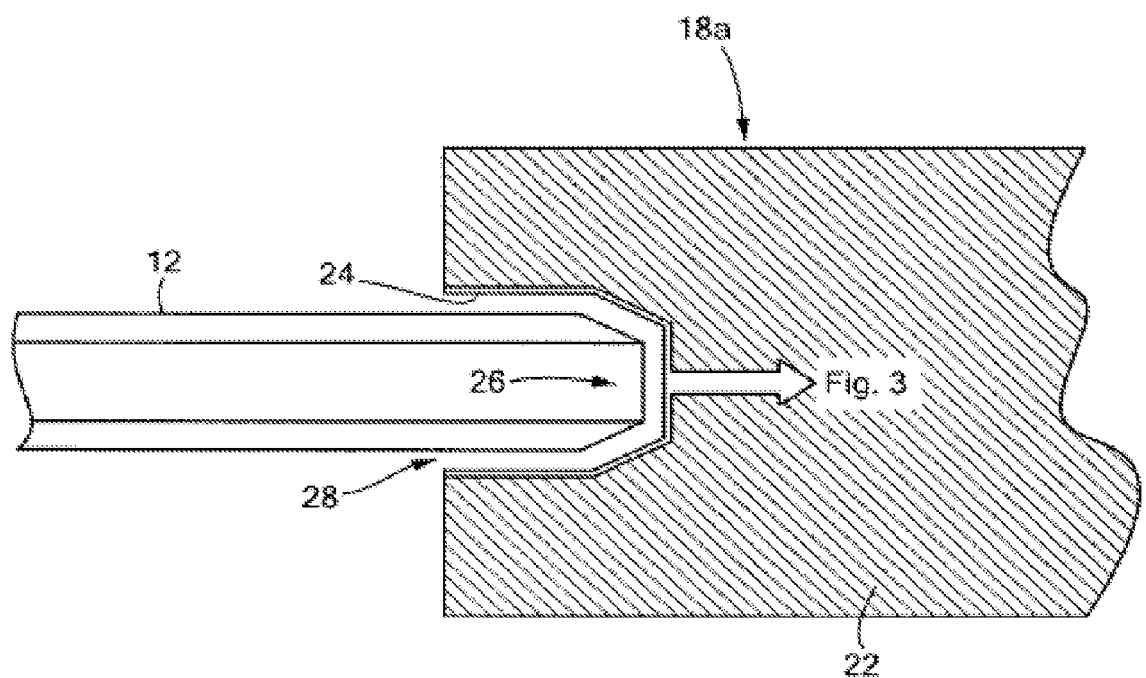
FIG. 2A illustrates one embodiment of the invention using a single edge conforming capacitive sensor.

FIG. 2A shows a probe assembly 18a having a dielectric body 22 with an edge conforming electrode 24 in a gap 26. An edge 28 (typically 1-3 mm) fits within the gap and the wafer and electrode 24 are connected to opposite polarity inputs of processing electronics of FIG. 3. In this connection, the electronics can sense the capacitance between the electrode 24 and the edge 28. The capacitance varies inversely with the distance between the electrode and wafer so the processing electronics, using known techniques, preferably inverts the capacitance signal to provide a signal varying directly with distance.

FIG. 2B shows an end-on view of the probe assembly 18a with guard electrodes on either side and nominally driven at the same potential as the measuring electrode 24. The guard electrodes function to linearize the response of the electrode 24 by, for example, eliminating fringe fields.

FIG. 2C shows a multi-electrode probe assembly 18b according to the invention. In this case five electrodes 24 are shown, but any number from two up are possible. Also some of the electrodes 24, for example the center and outside ones, may function as guard electrodes.

Figure 3:
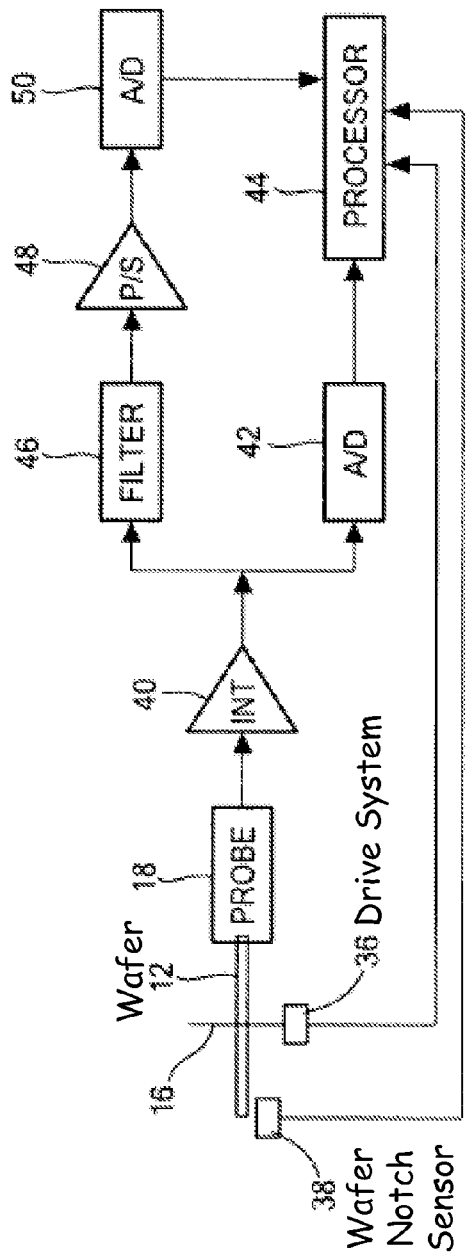
FIG. 3 illustrates processing electronics of the invention for characterizing wafer edge phenomena.

FIG. 3 shows processing electronics which are used in the invention to process the signal from each electrode 24 representing a change in capacitance. The wafer 12 is rotated by a drive system 36 causing the edge to move through the sensing gap of the probe assembly 18. The drive may be of a precision type to insure accurate knowledge of the position of the wafer edge at every instant of time; or a precision angular encoder may be used in the drive system 36. A wafer notch sensor 38 may be used as well to periodically calibrate the knowledge of the wafer position.

Interface electronics 40 are provided to accomplish demodulation of the AC drive signal for the probe electrodes, and in some embodiments, linearization of the raw capacitance signal. This signal is then split onto two paths. In the lower first, the signal is digitized in a Low resolution A/D converter for application as digital input to a computer based processing system. The processing system 44 simultaneously receives time or encoder based positioning information from the drive system 36 and notch detector 38. The low resolution information provided in this processing channel is useful for incremental scale factor determination in the processor 44.

The upper channel for the signal from the interface circuitry 40 includes a filter 46 for removing the predictable run-out error component, which typically dominates the signal magnitude. A pre-scaling circuit 48 then typically boosts the signal level to a useful range by enough to cause, without the run-out removal, saturation. Digitizing in an A/D converter 50 at higher or moderate resolution allows a properly ranged digital signal to be applied to the processor 44. It should be noted that some signal processing, like inversion, could be reserved for the processor 44 instead.

Figure 3A:
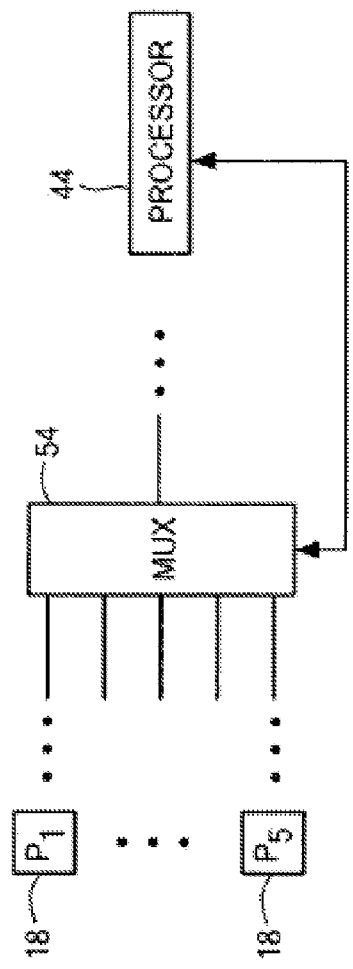
FIG. 3A illustrates a multiplexing alternative to the processing electronics of the invention.

In the case of multiple probe assemblies the circuitry of FIG. 3 can be replicated for each assembly 18. Alternatively as shown in FIG. 3A a multiplexing system 54 can be used to combine the signals into a single processor input at an appropriate point in the circuitry.

Figure 4:
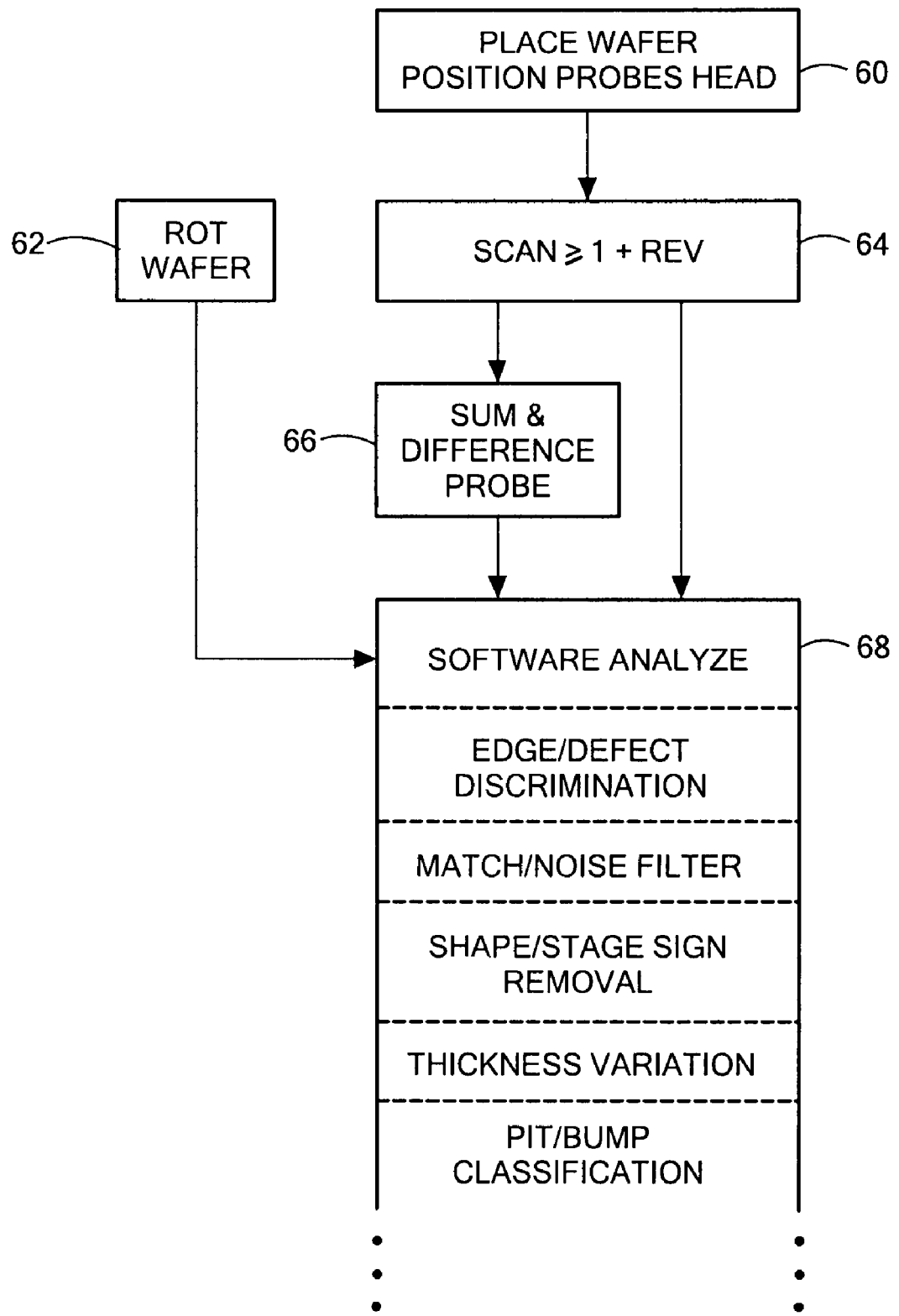
FIG. 4 illustrates processing steps in the process of wafer edge characterizing according to the invention.
Figure 5:
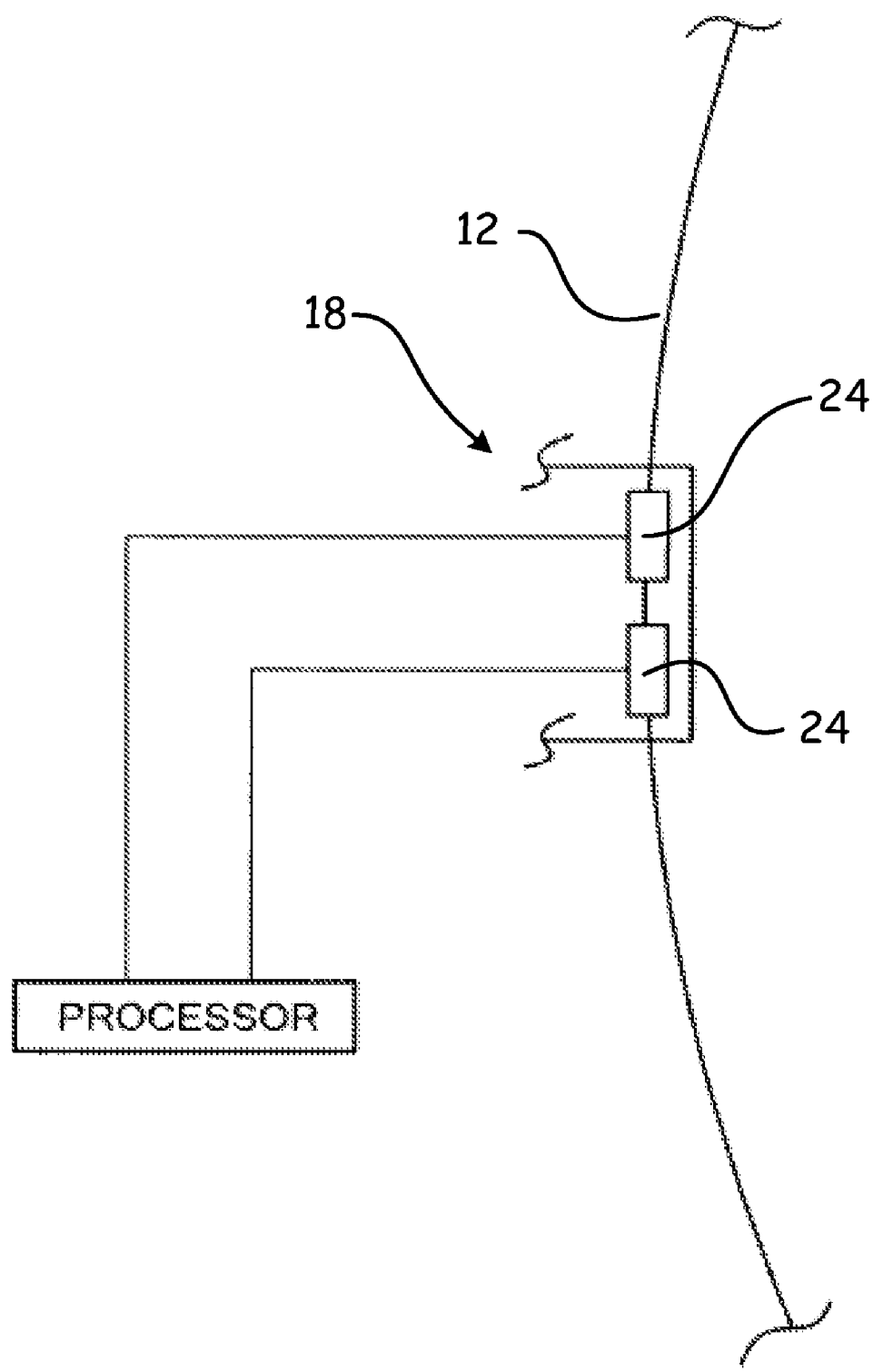
FIG. 5 illustrates laterally displaced probe electrodes according to the invention.

In checking a wafer, processing according to FIG. 4 is used. Initialization steps 60 set the test station up manually or automatically with the wafer on the turntable 14 and the assembly 18 in test position. In a step 62 the wafer rotation is started and then in a step 64 data is accumulated in the processor 44 for a minimum of one rotation of the wafer. In the case of plural probe measuring electrodes a step 66 may be employed to difference and sum the output of two electrodes in the assembly. The differenced signal cancels out all common mode errors leaving a nearly pure distance signal representing the difference in distance between the differential probe elements and the wafer's surface.

The data accumulated and processed to this point is then analyzed by software in the processor system according to one or more known techniques under software processing 68 to provide characterization of the wafer edge according to diverse means. The software will discriminate between edge defects and normal edge properties. Match filtering, fitting, and other techniques to improve signal-to-noise ratio can also be done in software along with wafer shape and stage or turntable-signature removal. Additional processing is used to find thickness variations, for example, with multi-electrode assemblies. Determination of whether a bump or pit has been sensed is also provided by software using known techniques.

Figure 6:
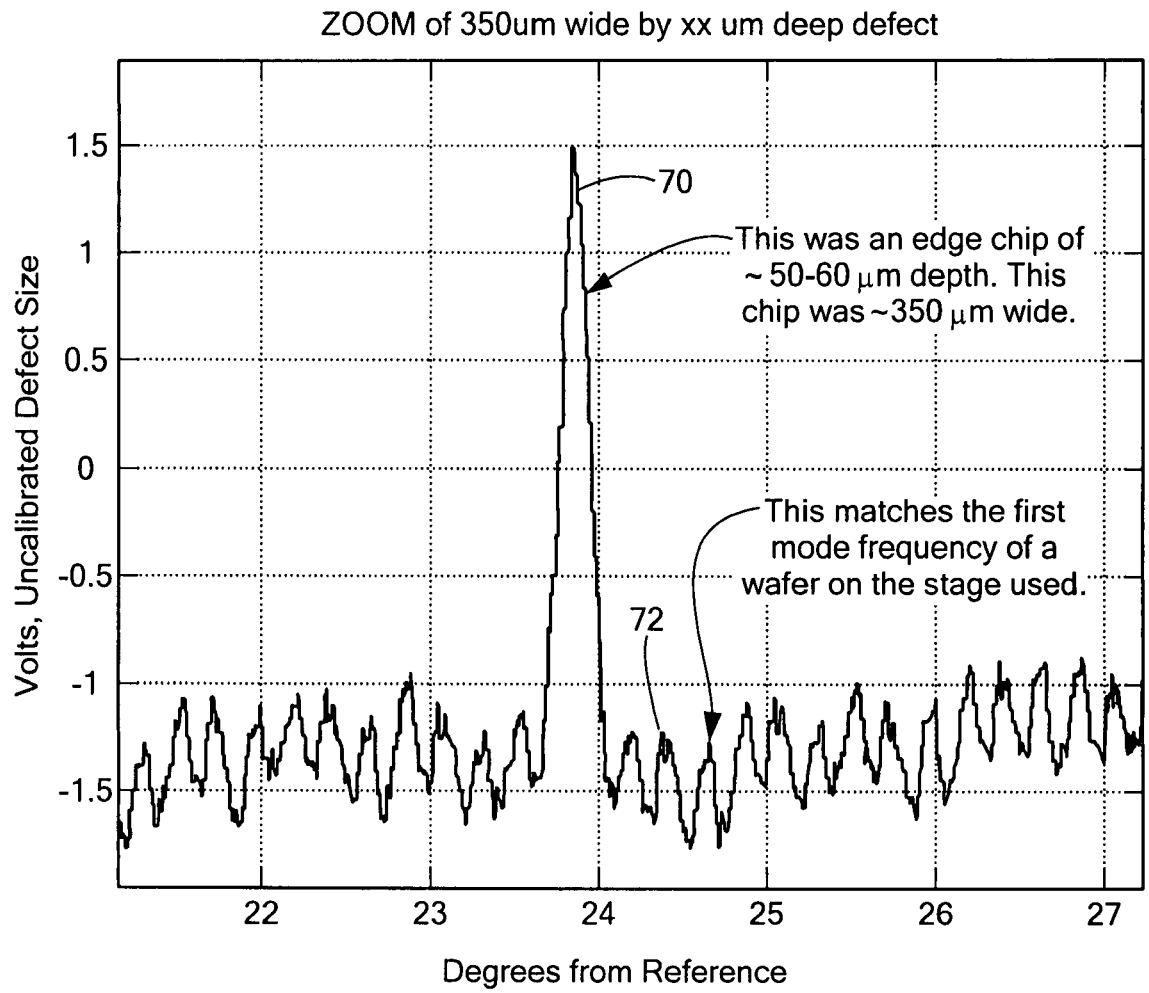
FIG. 6 shows a typical waveform of defect and filtered noise from the edge sensor of the invention.

FIG. 6 illustrates an example of defect 70 detection as a function of angular wafer position. Filtering and demodulation techniques described above have limited background noise and other error components to a relative low value at 72.

These and other features of the invention may be practiced by those skilled in the art, the scope of the invention being only as limited by the following claims.

What is claimed is:

1. A wafer edge-defect detection system comprising:
   a probe assembly having one or more capacitive plates forming a gap, the probe assembly for receiving a wafer in the gap;
   the one or more capacitive plates conforming to an edge shape of the wafer by extending from a top surface of the wafer, around an edge of the wafer, to a bottom surface of the wafer;
   processing electronics for electronically driving the one or more capacitive plates and for sensing an electrical signal representing capacitance between each one or more plates and the wafer.

2. The detection system of claim 1 wherein said probe assembly has one capacitive plate and one or more guard plates.

3. The detection system of claim 1 wherein said probe assembly has two or more capacitive plates separated one from the other in a vertical direction referenced to the wafer height.

4. The detection system of claim 3 wherein said two or more plates are separated from one another in a circumferential direction around said wafer.

5. The detection system of claim 1 wherein said processing electronics includes an AC capacitive plate drive and a demodulator for the sensed electrical signal producing an output reflecting capacitance variation.

6. The detection system of claim 1 wherein said processing electronics includes a means for differing the sensed signals from two or more plates.

7. The detection system of claim 2 wherein said processing electronics provides an output indication of defects in the crown of the wafer.

8. The detection system of claim 2 wherein said processing electronics is responsive to sensed capacitance provides an indication of edge thickness.

9. The detection system of claim 1 further including a servo system responsive to sensed capacitance for maintaining a probe to wafer edge distance.

10. The detection system of claim 1 further including means for correlating wafer position with sensed capacitance.

11. The detection system of claim 10 wherein said correlating means includes one of spinning the wafer past said probe a constant rate and encoding wafer position.

12. The detection system of claim 1 wherein said processing electronics includes parallel A/D converters one of which is of low resolution and determines incremental scale factor information therefrom.

13. The detection system of claim 1 further including a reference probe for measuring runout error and shape information on the wafer when moving.

14. The detection system of claim 1, wherein said processing electronics includes means for providing one or more of edge/defect discrimination, match and/or noise filtration, shape and stage signature removal, thickness determination, pit and bump classification and incremental scale factor determination.

* * * * *